US006391700B1

(12) United States Patent
Tsay

(10) Patent No.: US 6,391,700 B1
(45) Date of Patent: May 21, 2002

(54) METHOD FOR FORMING TWIN-WELL REGIONS OF SEMICONDUCTOR DEVICES

(75) Inventor: Kuen-Shyi Tsay, I-Lan (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/690,505

(22) Filed: Oct. 17, 2000

(51) Int. Cl.$^7$ .......................................... H01L 21/8238
(52) U.S. Cl. ...................... 438/224; 438/228; 438/229; 438/232; 438/514; 257/371
(58) Field of Search ................. 438/224, 228, 438/229, 232, 514; 257/371

(56) References Cited

U.S. PATENT DOCUMENTS

| | | | | |
|---|---|---|---|---|
| 4,434,543 A | * | 3/1984 | Schabe et al. | 438/228 |
| 4,435,895 A | * | 3/1984 | Parrillo et al. | 438/228 |
| 5,573,963 A | * | 11/1996 | Sung | 438/228 |
| 5,624,857 A | * | 4/1997 | Yang | 438/228 |
| 5,661,067 A | * | 8/1997 | Lee et al. | 438/420 |
| 5,866,447 A | * | 2/1999 | Liu | 438/229 |
| 5,933,722 A | * | 8/1999 | Hong | 438/228 |
| 6,017,787 A | * | 1/2000 | Chittipeddi et al. | 438/224 |

FOREIGN PATENT DOCUMENTS

| | | | | |
|---|---|---|---|---|
| KR | 9200229 B | * | 1/1992 | H01L/29/76 |
| TW | 322629 A | * | 12/1997 | H01L/21/8238 |
| TW | 328635 A | * | 3/1998 | H01L/21/74 |
| TW | 381324 A | * | 2/2000 | H01L/21/8238 |

OTHER PUBLICATIONS

Sorab K. Ghaddhi VLSI Fabrication Principles second edition Wiley and Sons, Inc. pp. 649 and 736.*

* cited by examiner

Primary Examiner—Charles Bowers
Assistant Examiner—David S Blum
(74) Attorney, Agent, or Firm—Powell Goldstein; Frazer & Murphy

(57) ABSTRACT

A pad oxide layer is formed on a substrate, wherein the thickness of the pad oxide layer is about greater than 250 Å. The alignment photo-resist layer is selectively patterned by a conventional lithography method to define the N-well region. The pad oxide layer is partially etched by using etch method with the alignment photo-resist pattern as a mask until the thickness of the pad oxide layer is about 100 Å to form an alignment mark. The N-type ion-implant is performed by the alignment photo-resist pattern as a mask to form an N-doped region in the substrate. Then, the alignment photo-resist pattern is removed. The P-well photo-resist is defined and formed on the pad oxide layer, then performing a P-type ion-implant through the pad oxide layer into the substrate by means of the P-well photo-resist as a mask to form a P-doped region. Then remove the P-well photo-resist and proceed with the drive-in process to form the N-well region and P-well region.

14 Claims, 11 Drawing Sheets

METHOD FOR FORMING TWIN-WELL REGIONS OF SEMICONDUCTOR DEVICES

BACKGROUND OF THE INVENTION

1. Field of the Invention

The present invention relates generally to a method for forming semiconductor devices process, and more particularly to a method for forming a twin-well of the semiconductor devices.

2. Description of the Prior Art

The escalating requirements for high densification and performance associated with ultra large scale integration (ULSI) semiconductor devices requires minimal design features, and under, increased transistor and circuit speeds, high reliability and increase manufacturing throughput for competitiveness. The reduction of design features to 0.25 micron and under generates acute problems challenging the limitations of conventional semiconductor manufacturing technology, particularly for increased manufacturing throughput and cost reduction. There are rugged topographies during fabricating a semiconductor device structure, and these rugged topographies can be used as alignment marks of the lithography steps. For example, the field oxide isolation layer is formed on the silicon substrate that can be used as alignment marks of the lithography steps for following polysilicon gate process.

As integrated circuits are miniaturized more and more, these devices introduce a vertical structure more often than a conventional planar structure. Various problems are encountered in the manufacture, for example, with a twin-well process of an integrated circuit device. One problem is that the topography between N-well and P-well of a twin-well device is not at the same horizontal level that lowers the production line throughout. Therefore, it will need an extra photo-mask for zero layer alignment to avoid this phenomenon. The circuit layout patterns are transferred from photo-masks to the surface of the silicon wafer using a photolithography process. Each layer followings the zero layer must be carefully aligned to the previous pattern on the wafer. Alignment marks are introduced on each mask and transferred to the wafer as part of the integrated circuit pattern. This process will increase the number of manufacturing steps and the production cost.

As illustrated in FIG. 1A to 1D, continuously forming a pad oxide layer 110 and a nitride layer 120 on a substrate 100. The photo-resist layer 130 is selectively patterned on the nitride layer 120 by a conventional lithography method. The nitride layer 120 is partially etched by using etch method with the photo-resist pattern 130 as a mask to define an N-well region 150. The N-type ion-implant 140 is performed by the photo-resist pattern 130 as a mask to form an N-doped region 150 in the substrate 100. Then, the photo-resist pattern 130 is removed. The well-oxide layer 160 is grown over the N-well region 150. Next, the nitride layer 120 is stripped by etch method. The P-type ion-implant 170 is performed by means of the well-oxide layer 160 as a mask to form the P-doped regions 180 in the substrate 100. Performing the well drive-in step form the twin-well in the substrate 100. Finally, the well-oxide layer 160 and pad oxide layer 110 are removed to finish the twin-well process. This twin-well process has a difference 190 in level between the surface of the N-well and P-well.

As illustrated in FIG. 2A to 2F, continuously forming a pad oxide layer 205A and a nitride layer on a substrate 200. The photo-resist layer is formed on the nitride layer, and patterned selectively by the lithography method to form a photo-resist mask 215A and alignment mark photo-resist patterns 215B. The nitride layer is partially etched by using etch method with the photo-resist mask 215A and an alignment mark photo-resist pattern 215B as the etching masks to form an nitride layer 210A and alignment marks 210B. Then, the photo-resist mask 215A and an alignment mark photo-resist pattern 215B are removed. The N-well photo-resist 220 is formed on the nitride layer 210A, then performing an N-type ion-implant 225 through the nitride layer 210A and the pad oxide layer 205A into the substrate 200 by means of the N-well photo-resist 220 as a mask to form an N-doped region 230. Then, the N-well photo-resist 220 is removed. The P-well photo-resist 235 is formed on the nitride layer 210, then performing a P-type ion-implant 240 through the nitride layer 210 and the pad oxide layer 205A into the substrate 200 by means of the P-well photo-resist 235 as a mask to form a P-doped region 245. Then remove the P-well photo-resist 235 and proceed with the drive-in process to form the N-well 250 and P-well 255. The actively region photo-resist layers 260 are defined selectively on the nitride layer 210 of the N-well 250 and P-well 255 segments. Next, the nitride layer 210A is etched by the actively region photo-resist layers 260 as the etching masks to form the nitride layers 210C. Thereafter, the actively region photo-resist layers 260 are stripped. The part of the pad oxide 205A between the nitride layers 210C is grown to form a field oxide (FOX) 205B. Finally, all of the nitride layers 210C and the pad oxide 205A are stripped but remained field oxide (FOX) 205B.

As illustrated in FIG.3A to 3E, forming a pad oxide layer 305 on a substrate 300. A zero photo-resist layer 310 is selectively patterned by a zero lithography method to define the zero trenches. The pad oxide layer 305 is partially etched by using etch method with the photo-resist pattern 310 as a mask to form the zero trenches 315, wherein the zero trenches 315 are the alignment marks for the follow-up process. The N-well photo-resist layer 320 is selectively patterned by a conventional lithography method. The N-type ion-implant 325 is performed by the N-well photo-resist pattern 320 as a mask to form an N-doped region 330 in the substrate 300. After the well-oxide layer 335 is grown over the N-doped region 330, removing the N-well photo-resist pattern 320. The P-type ion-implant 340 is performed by means of the well-oxide layer 335 as a mask to form a P-doped region 345 in the substrate 300. The pad oxide 305 and the well-oxide layer 335 are then removed. Finally, performing the well drive-in step form the twin-well in the substrate 300, but there is a difference 360 in level between the surface of the N-well 350 and P-well 355.

These twin-well processes of above are not only complicated but also to form rugged topographies on the substrate, as shown in FIG. 1D and FIG. 3E. The difference in level will result in the production cost increasing, and the rugged topographies affect the succeeding lithography process yet, so that the critical dimension is more difficult to control during the sub-micron process. Although the alignment marks had made for follow-up lithography process, as shown in FIG. 2A and FIG. 3A, 3B, the alignment between the N-well and the P-well can be not checked whether it is exact. Furthermore, these twin-well processes of above are complicated due to add the zero layer process.

In accordance with the above description, a new and improved method for forming the twin-well regions of semiconductor devices is therefore necessary, so as to raise the yield and quality of the follow-up process.

SUMMARY OF THE INVENTION

In accordance with the present invention, a method is provided for fabricating twin-well regions of the semiconductor devices that substantially overcomes drawbacks of above mentioned problems arised from the conventional methods.

Accordingly, it is a main object of the present invention to provide a method for fabricating the twin-well regions of semiconductor devices, so as to form surface without rugged topographies to solve the issues of the succeeding lithography process. Hence, the method of the present invention is appropriate for deep sub-micron technology to provide the semiconductor devices.

Another object of the present invention is to provide a method for forming the twin-well regions. The present invention can simplify manufacturing step of conventional twin-well regions process to reduce the production cost, and more particularly to form the twin-well regions without any alignment mark, so that reduce the step for forming the alignment masks.

Still another object of the present invention is to provide an alignment method for aligning N-well and P-well exactly. The present invention uses the pad oxide layer that has been etched as an alignment mark substitute for forming the alignment marks of conventional process. Furthermore, the method for etching the pad oxide layer will not result in the surface of substrate such as rugged topographies. Hence, the method of the present invention can correspond to economic effect.

In accordance with the present invention, a new method for forming semiconductor devices is disclosed. First of all, a pad oxide layer is formed on a substrate, wherein the thickness of the pad oxide layer is about greater than 250 Å. The alignment photo-resist layer is selectively patterned by a conventional lithography method to define the N-well region. The pad oxide layer is partially etched by using etch method with the alignment photo-resist pattern as a mask until the thickness of the pad oxide layer is about 100 Å to form an alignment mark. The N-type ion-implant is performed by the alignment photo-resist pattern as a mask to form an N-doped region in the substrate. Then, the alignment photo-resist pattern is removed. The P-well photo-resist is defined and formed on the pad oxide layer, then performing a P-type ion-implant through the pad oxide layer into the substrate by means of the P-well photo-resist as a mask to form a P-doped region. Then remove the P-well photo-resist and proceed with the drive-in process to form the N-well region and P-well region. The nitride layer is then formed along the surface of the pad oxide layer. The actively region photo-resist layers are defined selectively on the nitride layer of the N-well region and P-well region segments. Next, the nitride layer is etched by the actively region photo-resist layers as the etching masks to form the nitride regions, and the actively region photo-resist layers are stripped. Thereafter, the pad oxide between the nitride regions are grown to form field oxide (FOX). Finally, the nitride layers and the pad oxide are stripped but remained the field oxide (FOX) to finish the twin-well process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The invention discloses herein is directed to a method of fabricating twin-well alignment marks of integrated circuits. In the following description, numerous details are set forth in order to provide a thorough understanding of the present invention. It will be obvious, however, to one skilled in the art of integrated circuits that these specific details need not be employed to practice the present invention. In other instance, well-known processing steps are not described in detail in order not unnecessarily obscure the present invention. A preferred embodiment of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
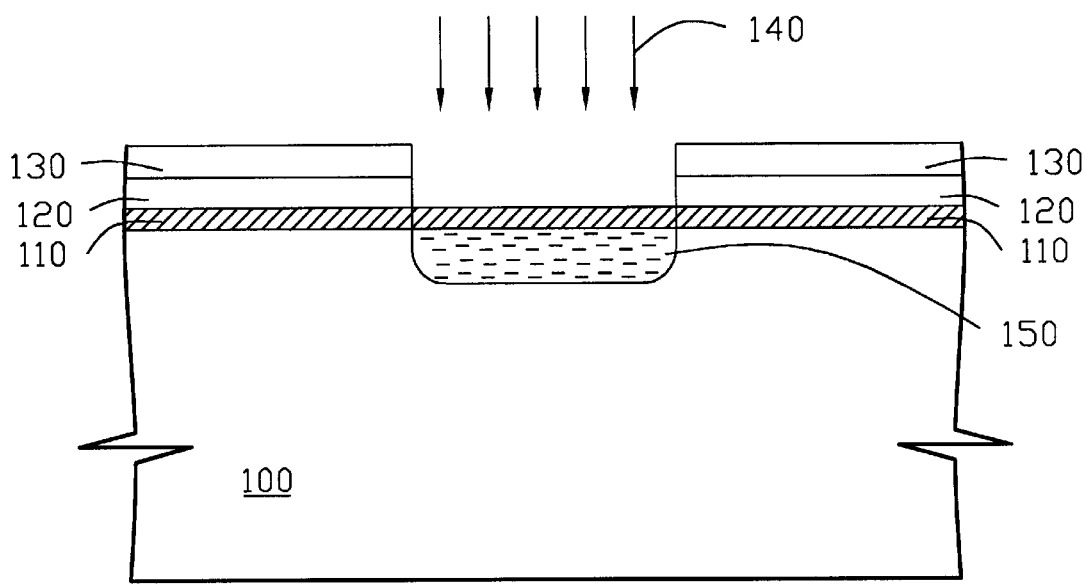
FIGS. 1A and 1D show cross-sectional views illustrative of various stages in the conventional twin-well regions process of the semiconductor devices without any alignment mark.
Figure 1B:
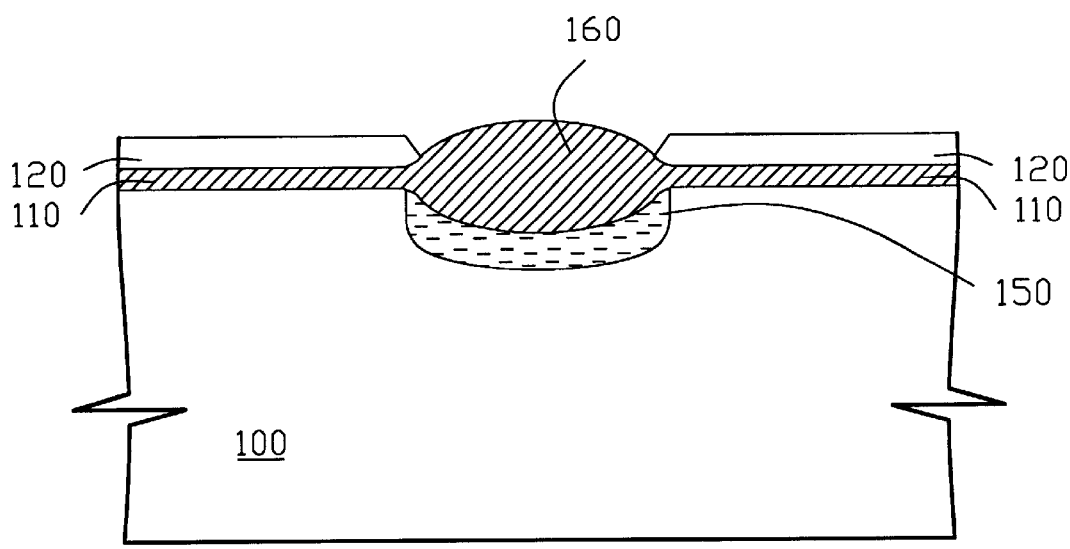
Figure 1C:
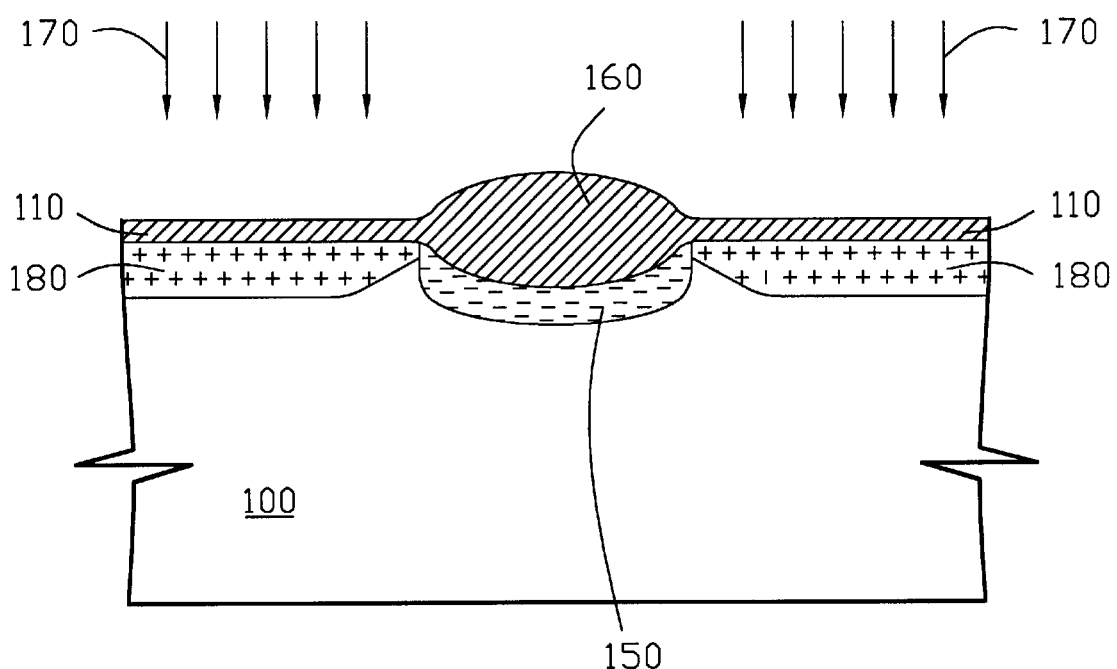
Figure 1D:
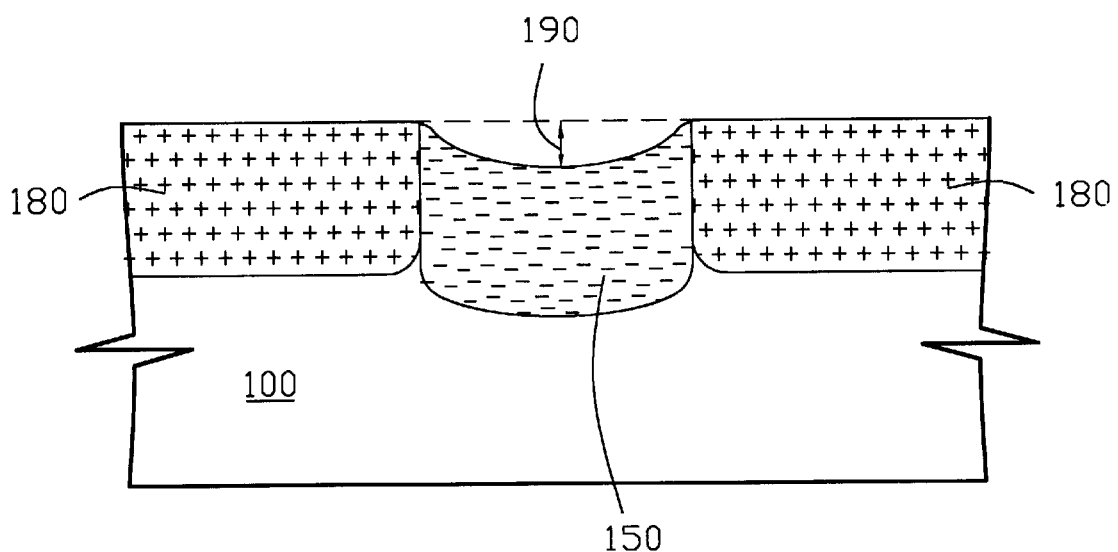
Figure 2A:
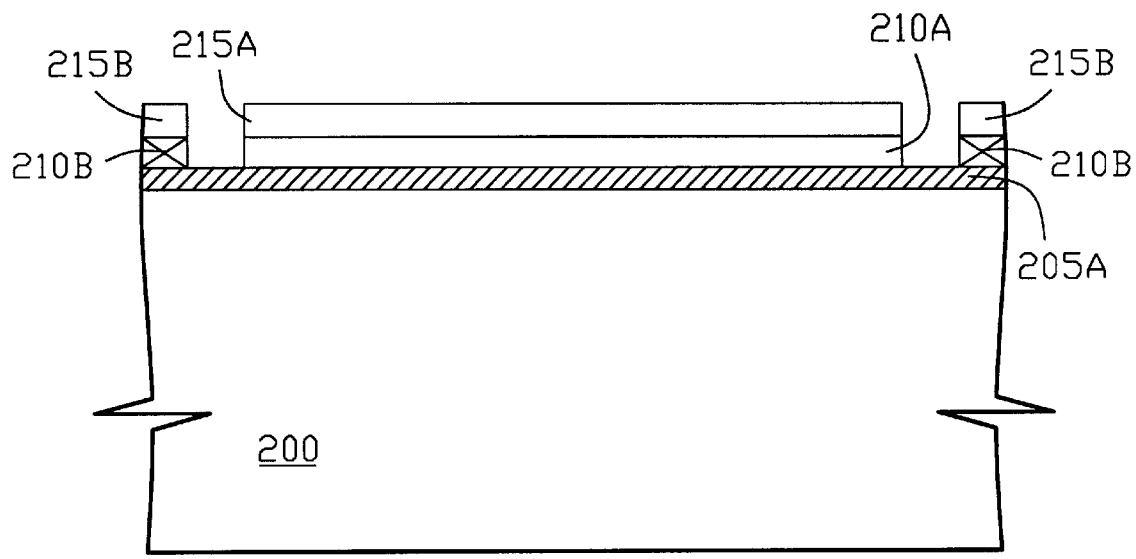
FIGS. 2A to 2F show cross-sectional views illustrative of various stages in the conventional twin-well regions process of the semiconductor devices having alignment marks.
Figure 2B:
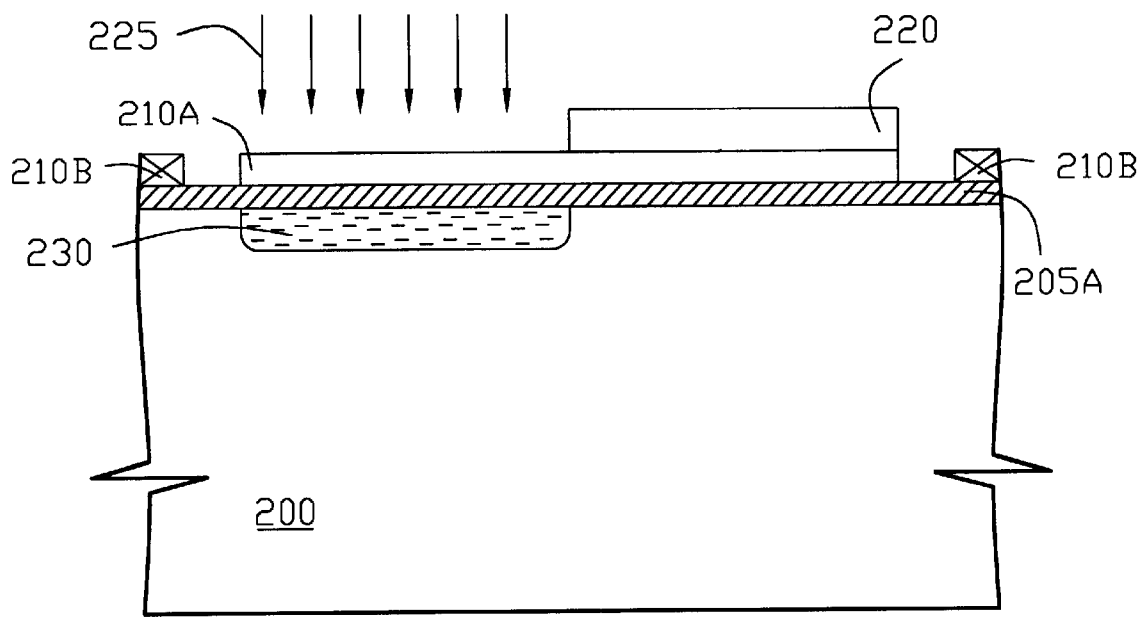
Figure 2C:
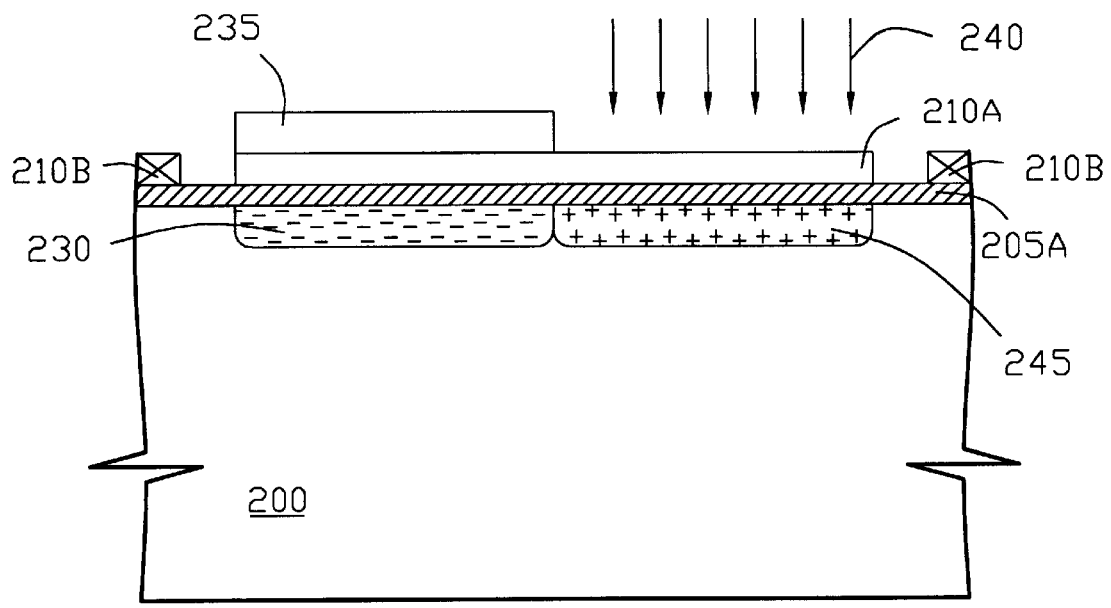
Figure 2D:
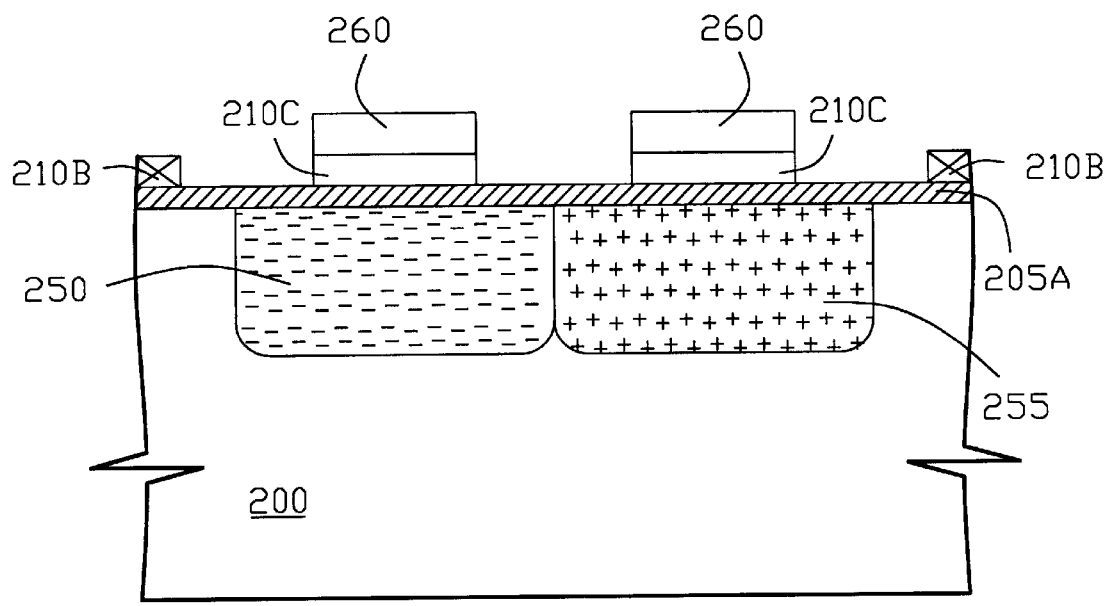
Figure 2E:
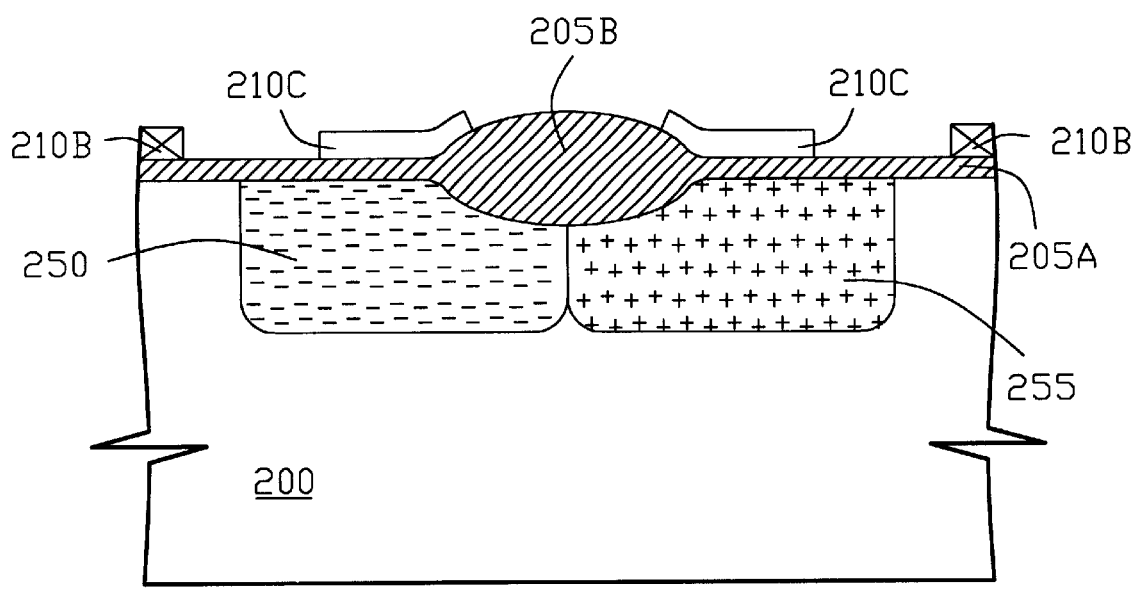
Figure 2F:
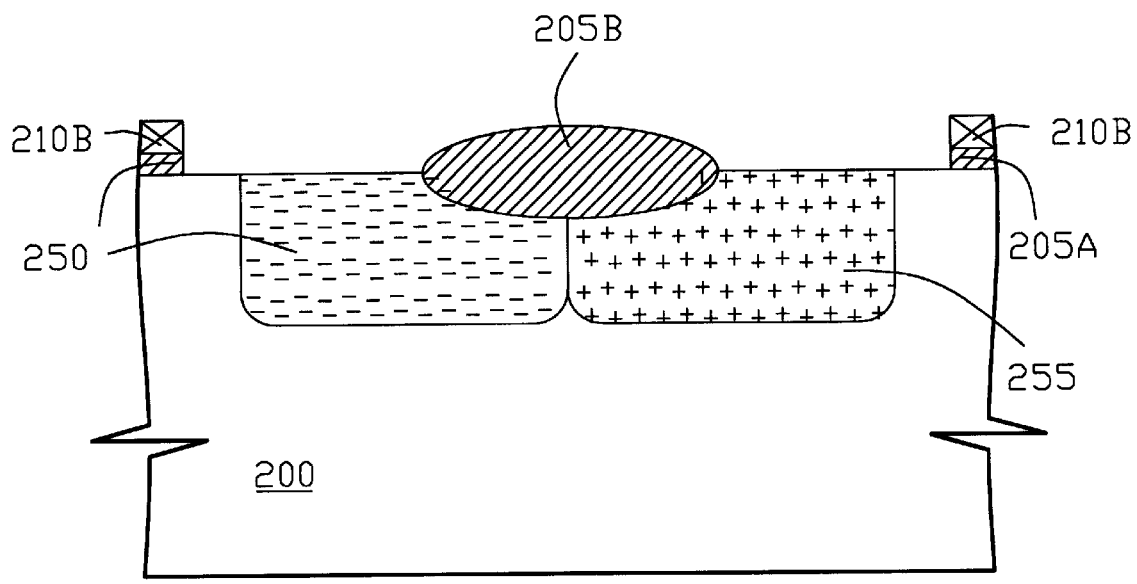
Figure 3A:
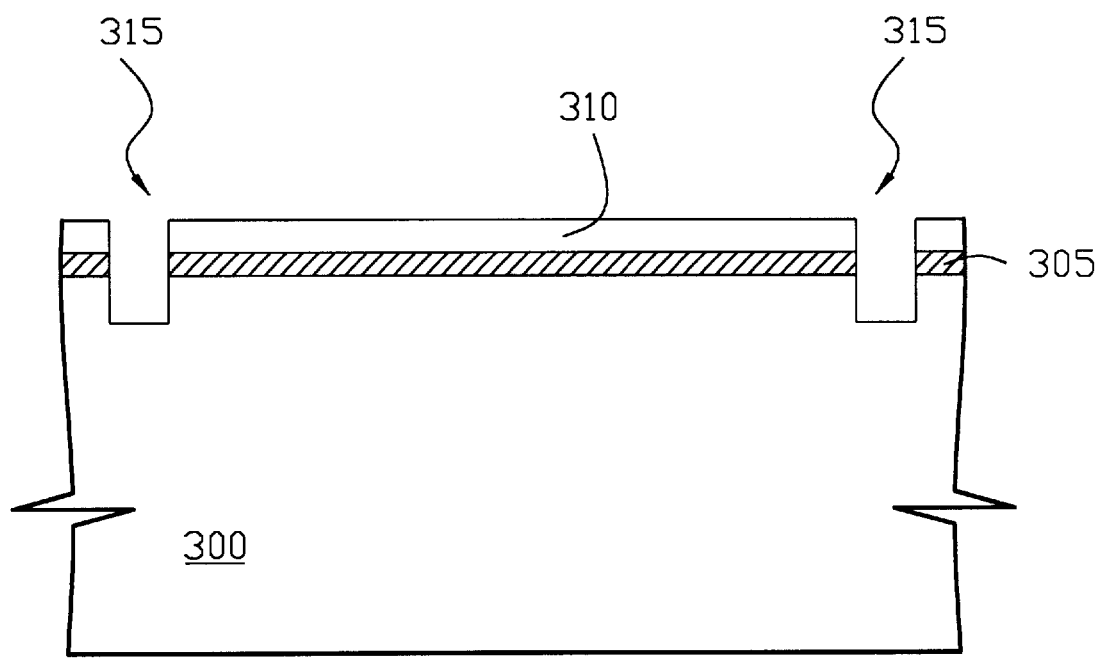
FIGS. 3A to 3E show cross-sectional views illustrative of various stages in the conventional twin-well regions process of the semiconductor devices having zero trenches as alignment marks.
Figure 3B:
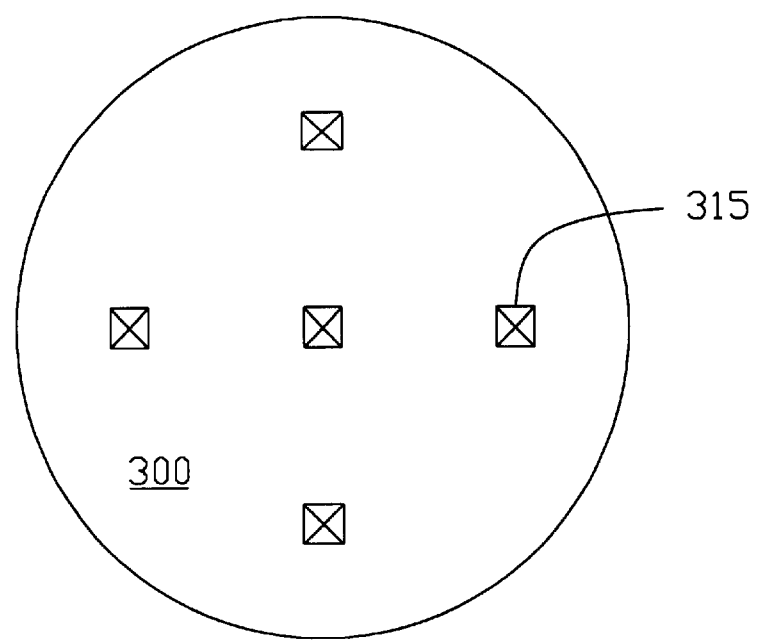
Figure 3C:
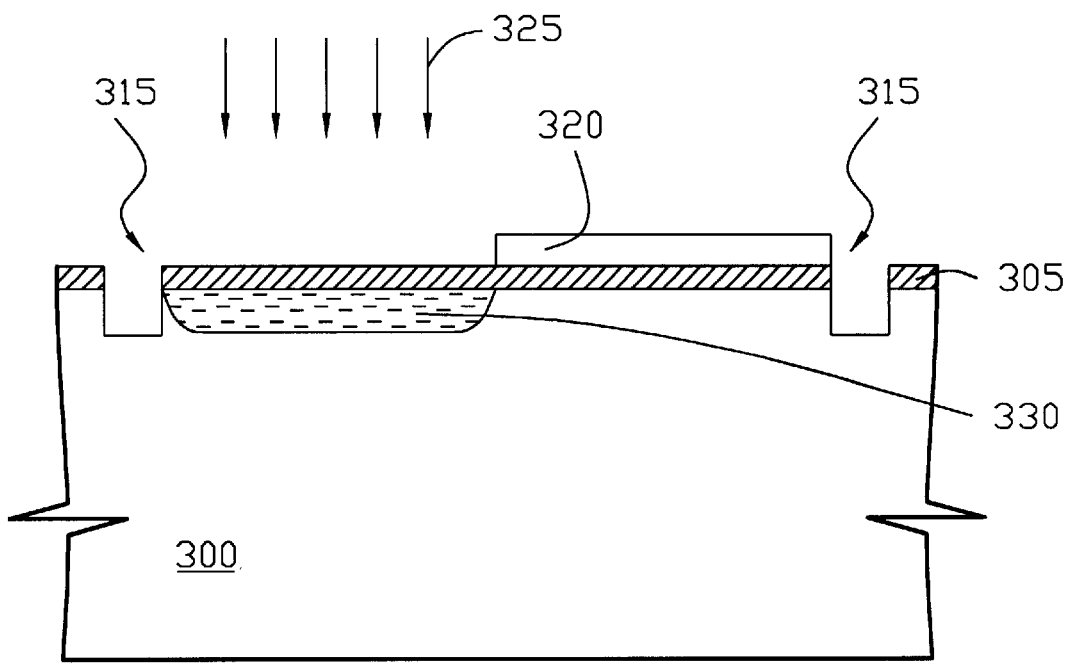
Figure 3D:
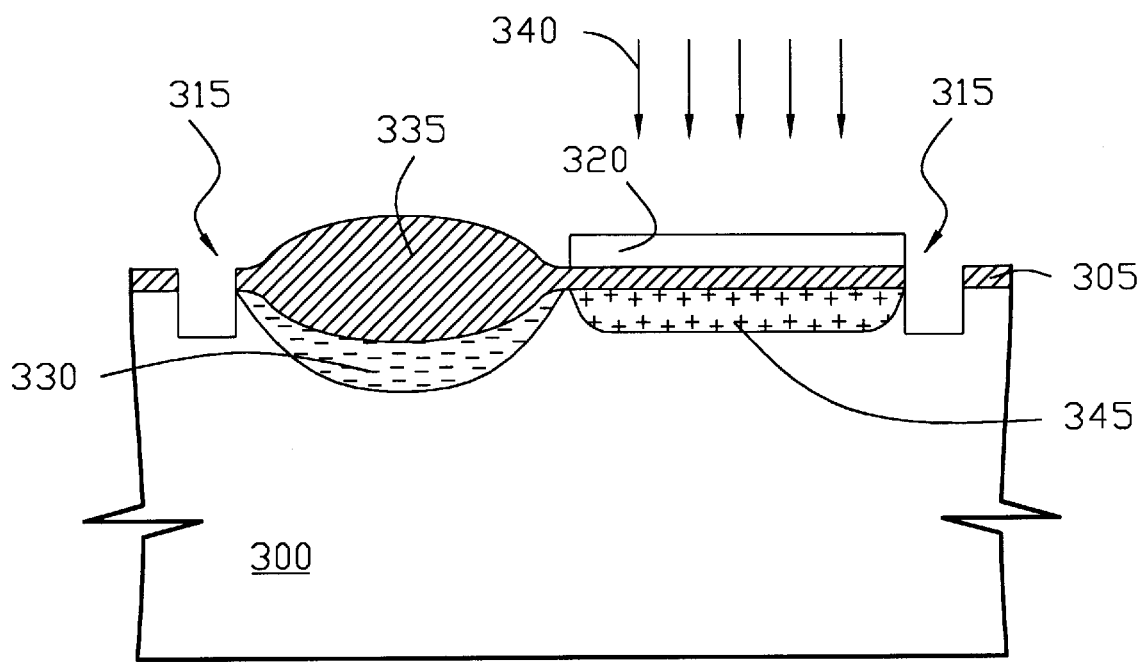
Figure 3E:
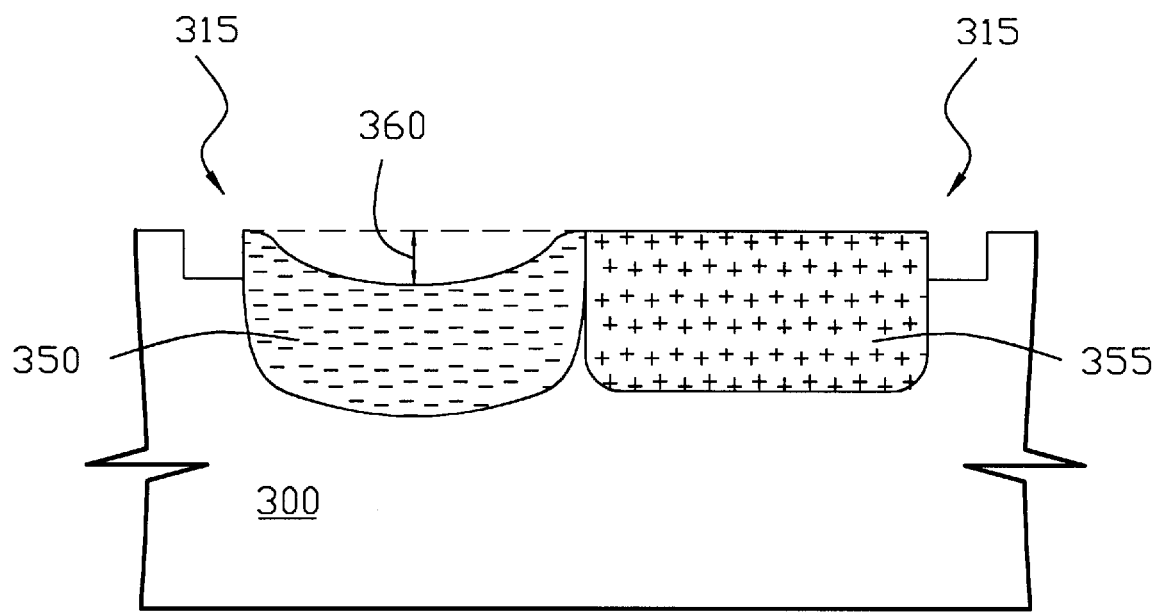
Figure 4A:
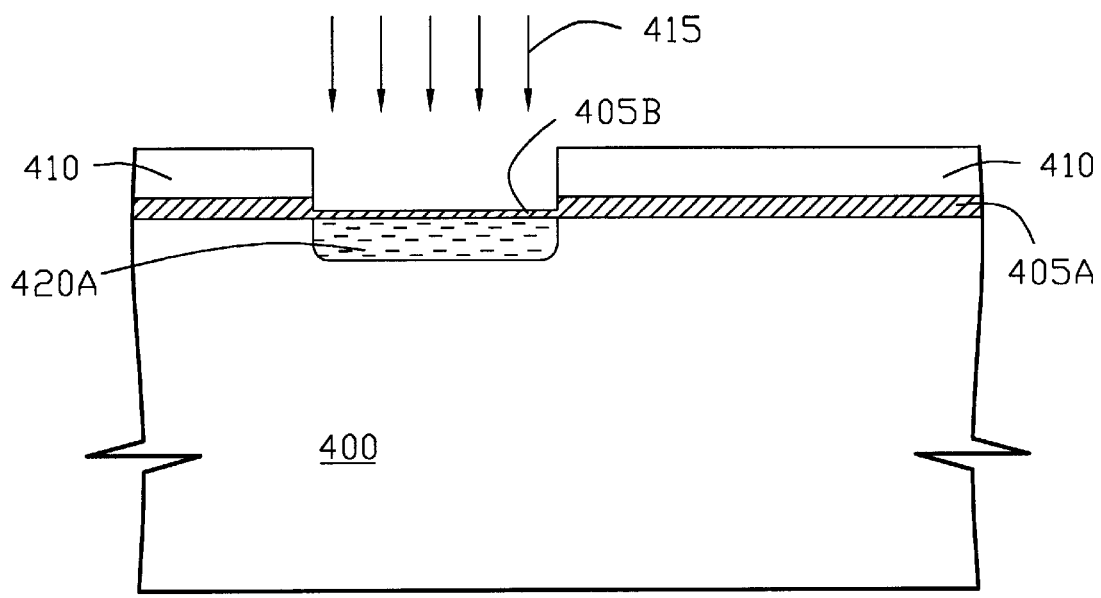
FIGS. 4A to 4E show cross-sectional views illustrative of various stages in the fabrication of semiconductor devices having the twin-well regions in accordance with one embodiment of the present invention.

As illustrated in FIG. 4A, in this embodiment, first of all, a pad oxide layer 405A is formed on a substrate 400, wherein the thickness of the pad oxide layer 405A is about greater than 250 Å. The alignment photo-resist layer 410 is selectively patterned by a conventional lithography method to define the N-well region. The pad oxide layer 405A is partially etched by using etch method, such as the buffered oxide etching (BOE) method, with the alignment photo-resist pattern 410 as a mask until the thickness of the pad oxide layer 405A is about 100 Å to form an alignment mark 405B. The N-type ion-implant 415 is performed by the alignment photo-resist pattern 410 as a mask to form an N-doped region 420A in the substrate 400. Then, the alignment photo-resist pattern 410 is removed.

Figure 4B:
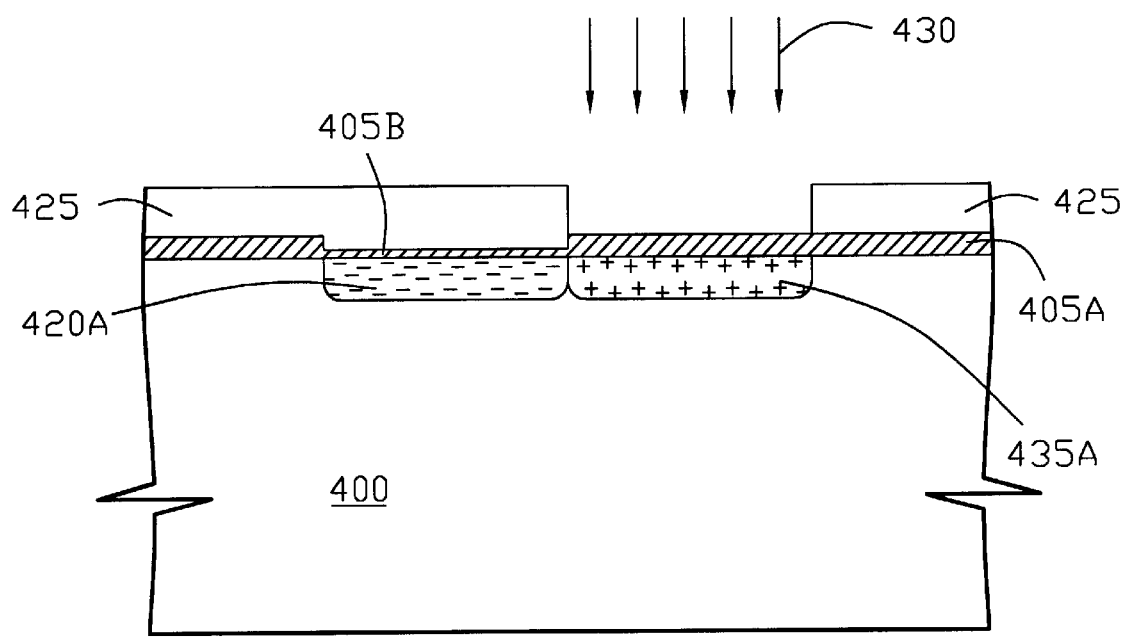
Figure 4C:
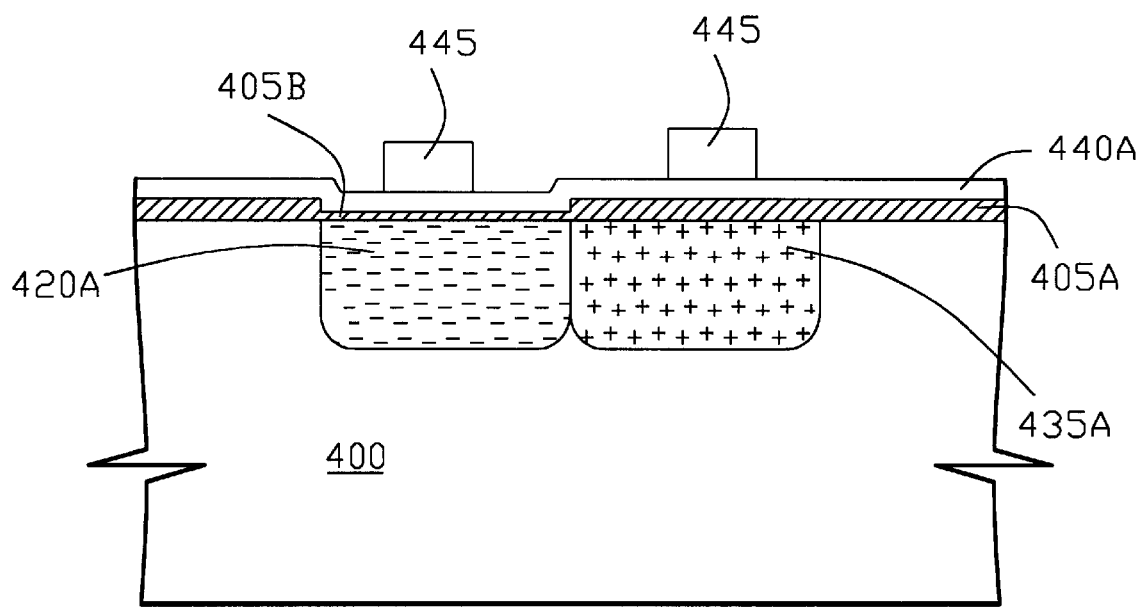

As illustrated in FIG. 4B, the P-well photo-resist 425 is defined and formed on the pad oxide layer 405A and 405B, then performing a P-type ion-implant 430 through the pad oxide layer 405A into the substrate 400 by means of the P-well photo-resist 425 as a mask to form a P-doped region 435A. Then removing the P-well photo-resist 425, and performing with the drive-in process for activating the N-doped region 420A and the P-doped region 435A to form the N-well region 420B and P-well region 435B. The nitride layer 440A is then formed along the surface of the pad oxide layer 405A and 405B. The actively region photo-resist layers 445 are defined selectively on the nitride layer 440A of the N-well region 420B and P-well region 435B segments, as shown in FIG. 4C.

Figure 4D:
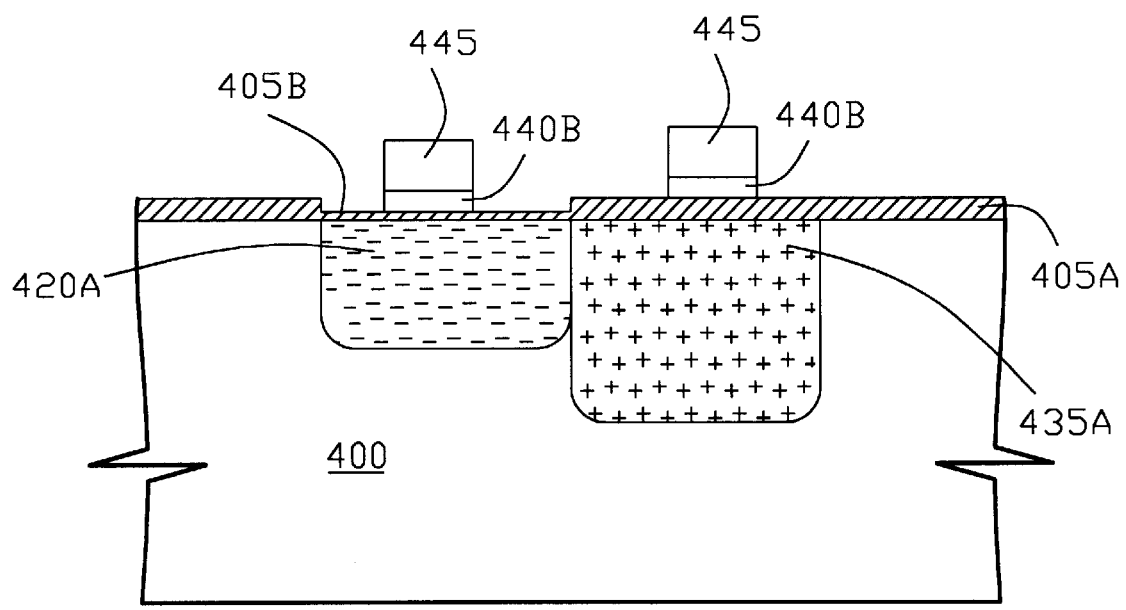
Figure 4E:
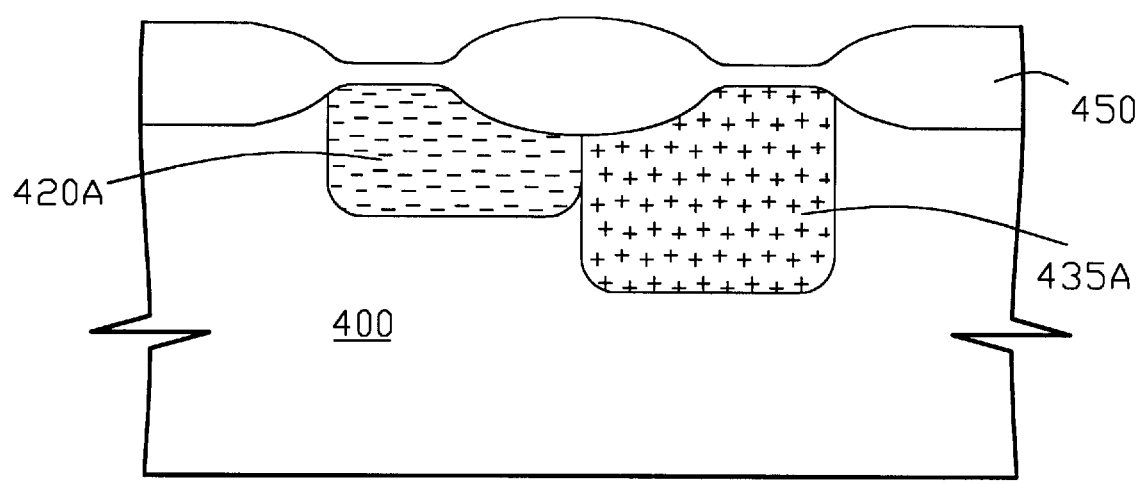

As illustrated in FIG. 4D, the nitride layer 440A is etched, such as reactive ion etching (RIE) method, by the actively region photo-resist layers 445 as the etching masks to form the nitride regions 440B. Then, the actively region photo-resist layers 445 are stripped. Thereafter, the pad oxide 405A and 405B on the substrate 400 are grown to form field oxide (FOX) 450. Finally, the nitride regions 440B and the pad oxide 405A and 405B are stripped but remained the field oxide (FOX) 450 to finish the twin-well regions process, as shown in FIG. 4E.

In this embodiment of the present invention, as discussed above, the present invention uses the method for etching the pad oxide layer to form an alignment mark. The alignment mark of the present invention can align exactly N-well and P-well, and it can also substitute the method of conventional process for forming the alignment marks, and more particularly to form the twin-well without any conventional alignment mark, so that reduce the step for forming the alignment masks and more particularly to form the twin-well without any alignment mark, so that reduce the step for forming the alignment masks. Further, the present invention does not need the zero lithography to form the zero trenches as alignment marks. There is the planer topography between the N-well region and P-well region for the succeeding process that is one importance of the present invention. As described in detail, according to the present invention, the field oxide (FOX) that is symmetrically located between N-well and P-well regions has a smooth topography. Therefore, the field oxide region can also be used as an ideal alignment mark for the succeeding lithographic steps that can simplify the manufacturing steps so as to increase production throughput. Hence, the method of the present invention can correspond to economic effect, it is also able to reach to purpose that economize on cost. Method of the present invention is the best semiconductor compatible process for deep sub-micro process.

Obviously, many modifications and variations of the present invention are possible in light of the above teachings. It is therefore to be understood that within the scope of the appended claims, the present invention may be practiced otherwise than as specifically described herein.

Although specific embodiments have been illustrated and described, it will be obvious to those skilled in the art that various modifications may be made without departing from what is intended to be limited solely by the appended claims.

What is claimed is:

1. A method for forming a semiconductor device having a twin-well region, said method comprising:
   providing a semiconductor substrate;
   forming an oxide layer on said semiconductor substrate;
   patterning a first photo-resist layer on said oxide layer to define a first well region;
   etching a partial thickness of said oxide layer by said first photo-resist layer as a mask to form an etched region as an alignment mark;
   performing a first ion-implant process by said first photo-resist layer as a mask and said etched region of said oxide layer as said alignment mark to form an first doped region in said semiconductor substrate;
   removing said first photo-resist layer;
   patterning a second photo-resist layer on said etched region of said oxide layer and another desired portion of said oxide layer to define a second well region;
   performing a second ion-implant process through said first oxide layer into said semiconductor substrate by said second photo-resist layer as a mask to form a second doped region;
   removing said second photo-resist;
   performing a drive-in process for activating said first doped region and said second doped region to form said first well region and said second well region;
   forming a nitride layer along the surface of said oxide layer;
   patterning a third photo-resist layer on said nitride layer of said first well region and said second well region to define a first actively region and a second actively region on said first well region and said second well region respectively;
   etching said nitride layer by said third photo-resist layer as a etching mask to form a first nitride region and a second nitride region on said first well region and said second well region respectively;
   removing said third photo-resist layer;
   forming a field oxide region between said second nitride layer and said third nitride layer; and
   removing said first nitride region and said second nitride region to form a semiconductor device having a twin-well region.

2. The method according to claim 1, wherein the method for forming said etched region of said oxide layer comprises a buffered oxide etching method.

3. The method according to claim 1, wherein said first ion-implant process comprises an N-type ion.

4. The method according to claim 1, wherein said second ion-implant process comprises a P-type ion.

5. The method according to claim 1, wherein the method for forming said first nitride region comprises a reactive ion etching method.

6. The method according to claim 1, wherein the method for forming said second nitride region comprises a reactive ion etching method.

7. The method according to claim 1, wherein said drive-in process is a thermal process.

8. A method for forming of a semiconductor device having a twin-well region, the method comprising:
   providing a semiconductor substrate;
   forming an oxide layer having a thickness that is great than 250 Å on said semiconductor substrate;
   patterning a first photo-resist layer on said oxide layer to define a first well region;
   etching said oxide layer until said thickness of said oxide layer is 100 Å by said first photo-resist layer as a mask to form an etched region as an alignment mark;
   performing a first ion-implant process by said first photo-resist layer as a mask and said etched region of said oxide layer as said alignment mark to form an first doped region in said semiconductor substrate;
   removing said first photo-resist layer;
   patterning a second photo-resist layer on said etched region of said oxide layer and another desired portion of said oxide layer to define a second well region;
   performing a second ion-implant process through said oxide layer into said semiconductor substrate by said second photo-resist layer as a mask to form a second doped region;
   removing said second photo-resist;
   performing a drive-in process for activating said first doped region and said second doped region to form said first well region and said second well region;
   forming a nitride layer along the surface of said oxide layer;
   patterning a third photo-resist layer on said nitride layer of said first well region and said second well region to define a first actively region and a second actively region on said first well region and said second well region respectively;
   etching said nitride layer by said third photo-resist layer as an etching mask to form a first nitride region and a second nitride region on said first well region and said second well region respectively;

removing said third photo-resist layer;

forming a field oxide region between said first nitride region and said second nitride region; and removing said first nitride region and said second nitride region to form a semiconductor device having a twin-well region.

9. The method according to claim 8, wherein the method for forming said etched region of said oxide layer comprises a buffered oxide etching method.

10. The method according to claim 8, wherein said first ion-implant process comprises a phosphorus ion.

11. The method according to claim 8, wherein said second ion-implant process comprises a boron ion.

12. The method according to claim 8, wherein the method for forming said first nitride region comprises a reactive ion etching method.

13. The method according to claim 8, wherein the method for forming said second nitride region comprises a reactive ion etching method.

14. The method according to claim 8, wherein said drive-in process is a thermal process.

* * * * *